United States Patent [19]

Grunwald

[11] Patent Number: 5,895,581

[45] Date of Patent: Apr. 20, 1999

[54] LASER IMAGING OF PRINTED CIRCUIT PATTERNS WITHOUT USING PHOTOTOOLS

[75] Inventor: John Grunwald, Ramat Gan, Israel

[73] Assignee: J.G. Systems Inc., Miami, Fla.

[21] Appl. No.: 08/881,387

[22] Filed: Jun. 24, 1997

[30] Foreign Application Priority Data

Apr. 3, 1997 [IL] Israel ..................................... 120598
Jun. 5, 1997 [IL] Israel ..................................... 120999

[51] Int. Cl.⁶ ..................................................... B44C 1/22
[52] U.S. Cl. ................... 216/13; 216/47; 216/51; 216/65; 428/209
[58] Field of Search ..................... 216/13, 20, 23, 216/41, 47, 48, 51, 65, 78, 105; 428/209, 901

[56] References Cited

U.S. PATENT DOCUMENTS 4,842,677  6/1989  Wojnarowski et al. ............ 216/65
5,505,320  4/1996  Burns et al. ...................... 216/65 X

*Primary Examiner*—William Powell
*Attorney, Agent, or Firm*—Browdy and Neimark

[57] ABSTRACT

The present invention relates to a method of manufacturing a conducting pattern on a non-conducting substrate, that leads to a printed circuit board (PCB). The method obviates the use of phototools and is known in the art as "direct write" (DW). It is achieved by coating the copper cladding of an insulating laminate with one or more very thin (1 to 10 micron) metallic layer or layers, that can act as copper etch-resists, when top-coated with at least one laser-imageable polymeric layer, where the principal function of the laser-defined polymeric coating is to achieve high resolution imaging, leaving the major "burden" of copper etch resistance to the metallic coating(s) that are exposed, bared following the laser imaging operation. The substantial advantage of this invention is that the etch resistance is principally achieved by the metal-bearing layer or layers underneath the organic areas that are left on the copper cladding following laser patterning. As a result, the PCBs prepared according to the present invention can use extremely thin layer(s) of laser-imageable organic coatings, and thereby achieve fast scanning speeds or low laser energies, since the organic/polymeric imaging resist is not relied-upon (exclusively) for etch resistance. Thus, the present invention teaches the concept that the polymeric, laser-definable resist has a dual function. The major one being image definition, and not copper etch resistance.

19 Claims, 4 Drawing Sheets

LASER IMAGING OF PRINTED CIRCUIT PATTERNS WITHOUT USING PHOTOTOOLS

BACKGROUND OF THE INVENTION

1. Technical Field of the Invention

The present invention is directed to forming copper conductors on a PCB via a computer-controlled imagewise laser scanning without using phototools.

2. Prior Art

U.S. Pat. No. 3,469,982 to Celeste describes the prior art currently practiced to image PCBs via phototools, using a polymeric UV sensitive dry film usually ~25 micron thick as the sole etch, or plating resist. It is the predominant method, because of its ease of application. The drawbacks reside in the high cost of generating phototools and the cost of manufacturing the dry film, limited resolution and laser imaging capabilities of the dry film, due at least in part to its heavy thickness of over 25 micron, and the environmentally unfriendly disposal features inherent in the manufacture and use of dry films.

The industry is making strenuous efforts to develop DW systems and thus obviate the need for phototools. Such efforts are abundantly reflected in the wealth of prior art literature, both in the form of patents and publications. The following published articles are referenced herewith as typical and pertinent: (1) Emerging technologies, PC fabrication, volume 18, No. 9, September 1995; (2) Laser Direct Writing of Copper on Various Thin-Film Substrate Materials, Applied Surface Science 46 (1990) 143–147, Elsevier Science Publishers B.V. (North Holland); Kuchta, Technological Requirements for Direct Imaging, Technical Paper No. 1, A 8/1, PC World Conventions, June 1990.

The contents of U.S. Pat. No. 5,328,811 is included by its reference. The method it describes has yet to surface in the industry. The patent teaches DW imaging via thermal laser energy that causes a redox reaction between two "reagents" applied on a metallic surface, such as the copper cladding of an unimaged PCB panel. Typically, the patent discloses the redox reaction of CuO with a reducing layer such as polyaldehyde, when impacted with the heat of a thermal laser. Areas that have been scanned with the thermal laser will cause the CuO to be reduced to copper metal, thereby allowing the copper to be selectively etched where exposed. Essentially, the CuO acts as etch resist or plating resist, wherein perhaps lies the reason for the difficulties that can be expected when attempting to practice the teachings of above-cited U.S. Pat. No. 5,328,811. Indeed, CuO cannot be relied upon to safely serve as a reliable etch resist, whether copper etching is done in ammoniacal or acid-based etchants. In the above cited patent, copper oxide or sulphide acts also as absorber of heat generated by the thermal laser. In some examples of above cited patent, etch resistance of copper metal can be aided by the reducer film covering the underlying copper oxide or sulphide. But the thrust of U.S. Pat. No. 5,328,811 is a redox reaction initiated by thermal laser between a first and second "reagent" overlying the copper cladding, and its application is therefore limited to thermal lasers. Herein perhaps lies the difficulty in its achieving industrial success, since such redox reactions are relatively slow and do not generally enable sharp image delineation.

OBJECTIVES OF THE INVENTION

It is an objective of the present invention to form copper conductors on a PCB via a computer-controlled imagewise laser scanning without using phototools. A further objective involves the use of UV as well as IR (thermal) or other lasers that can form an image, applying one or more metal-bearing layers over copper cladding, topped by a laser patternable organic polymeric coating. An additional objective is the use of a top laser patternable coating in the order of only 1 to 10 microns, avoiding "thick" (25 microns or higher) polymeric films which impede practicable scanning speeds, and thus enable low scanning energies.

Another concept objective is to allow the metal-bearing layers present between the copper-cladding and the top, laser imageable organic/polymeric coating, to minimize the deleterious effects on imaging of the high heat conductivity of copper, which can be especially detrimental when thermal lasers are the choice for imagewise patterning, causing poor line definition and poor image demarcation. Finally, the major purpose of this invention is to achieve DW, imagewise laser patterning of organic/polymeric coatings, wherein the organic/polymeric coating is in direct contact with metal-bearing layers other than essentially pure metallic copper, as currently practiced in the industry; and to rely on laser-patternable organic/polymeric coatings that do not react chemically with the underlying metal bearing layer or layers in a way to significantly alter the nature and etch resistance of such metal layers.

SUMMARY OF THE INVENTION

The present invention relates to a process for manufacturing a printed circuit board (PCB) without using phototools and via laser imaging, comprising, 1. Coating the surface of the copper cladding of a copper-clad laminate with at least one thin layer of metal other than copper, a metal alloy, and/or at least one thin layer of metal-based compound(s) that can act as copper etch resist;
2. Coating the surface of the layer(s) obtained in step No. 1 with at least one laser-patternable polymeric coating;
3. Laser imagewise scanning the coating(s) obtained in step No. 2;
4. Developing (if needed) the laser-scanned surface resulting from step No. 3, so as to expose/uncover the layer(s) obtained in step No. 1;
5. Etching or stripping (if needed) the layer(s) obtained in step No. 1, so as to expose the bare copper metal cladding of the laminate;
6. Etching a copper pattern of alternating conductors separated by insulating spaces on the laminate;
7. Stripping away the polymeric areas left on the surface of the metallic coating(s) obtained in step No. 2 and which co-acted as etch resist during copper etching; and
8. Optionally stripping away the layer(s) obtained in step No. 1, so as to expose the copper surface of the conductor pattern.

DETAILED DISCLOSURE OF THE INVENTION

Figure 1:
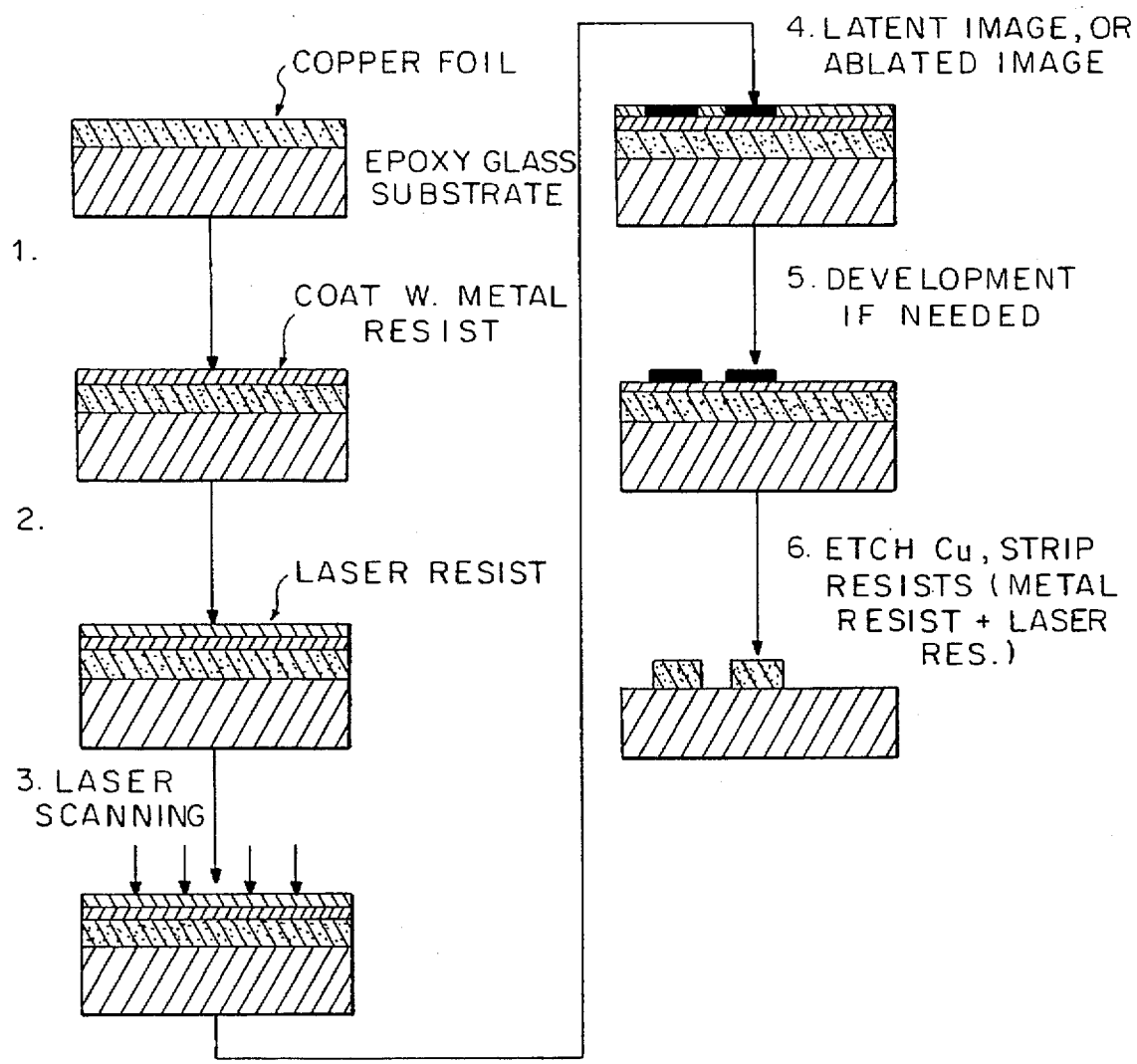
FIG. 1 is a schematic description of this invention, wherein a single metallic layer etch resist is coated with the laser imageable coating.

There are two major components to the embodiment of this invention:

1. Laser imagewise patterning of an organic polymeric top layer, creating areas that remain covered with the organic/polymeric coating, and other areas from which the coating has been removed as a result of laser-induced chemical reactions.
2. Each-resistant metal-bearing layer or layers that will stand up to the copper etchant solution, used to produce an array of copper electric conductors when exposed/uncovered/bared after laser imaging. Again, copper etch resistance is principally (though not solely) relied-upon the metal-bearing layer(s). The metallic etch resist can/will be complemented in the overall task of etch resistance by the organic/polymeric layer in areas where it remains after laser-induced selective patterning. It is thus a major concept of this invention to achieve copper metal etch resistance by relying principally on a metallic etch resist, assisted by the possibly limited etch resistance of the laser-patterned organic/polymeric coating overlaying the metallic resist layer or layers.

The attempts that have been made in the prior art to rely on metallic coatings for resisting copper etching, were mainly directed to replacing the predominantly used nefarious electroplated Sn/Pb with more environmentally friendly metals such as electroless nickel or chemical (immersion) tin. None of these attempts have achieved commercial success, mainly because of the presence of pinholes, or because of insufficient metallic coating thickness, both of which will cause defects in the copper conductors during copper etching.

In the present invention, such defects will be minimized by the complementary etch resisting function of the laser-patterned organic-polymeric layer on top of the metallic resist(s).over copper (or a combination of several very thin metallic layers), thereby enhancing their function as co-resists and minimize damaging effects of pinholes that may be present in the top laser-imaged layer.

As an alternative to producing such metallic layers by the PCB job shops or OEM shops, suppliers of PCB laminates such as GE, NELCO, Isola and others may conveniently market materials already coated with layer or layers of such metallic coatings.

The choice of the metallic coatings will be influenced by the nature of the copper metal etchant to be used, i.e. ammoniacal solutions disclosed in U.S. Pat. Nos. 3,231,403, 3,466,208, or acidic cupric chloride, acidic ammonium persulfate, acidic hydrogen peroxide, etc. When the laser of choice is of the IR, thermal type, the metallic coating should preferably be black, such as the well-known cupric oxides or black nickel (taught in U.S. Pat. No. 3,097,117), and the like. There is a host of literature that applies to solar energy absorbers from which one can draw helpful information on metallic coatings that optimize thermal efficiency.

The choice of lasers will depend on the composition/chemistry of the laser-imageable layer. The prior art offers an abundance of lasers covering a wide spectrum of wavelengths, from the low region (248 nm and 308 nm) to the longer bands, extending into the frequencies of about 1000 nm and higher. Thus, the person skilled in the art can match the chemistry of the top, laser-patternable layer to the type of laser that is suitable for the task.

The lasers that are most often encountered in the DW prior art, will emit either in the UV region (i.e. systems supplied by Polyscan Inc., a corporation of Arizona), blue light Argon beams (i.e. systems offered by Agfa-Gevaert A.G. of Germany) or higher wavelength lasers such as Nd: YAG, diode or CO2 type offered by a host of companies. The latter types (IR thermal lasers) have achieved, in recent years, significant commercial use in the digital printing arena. Indeed, wherever technologically possible, IR or thermal lasers are preferred over UV lasers due to availability and cost.

The types of laser patternings known in the prior art can be grouped in the following categories:

1. Laser that results in ablation of the organic/polymeric layer, exposing the underlying surface, without further steps. U.S. Pat. Nos. 4,054,094, 5,459,017, 5,506,086, 5,353,705, 5,262,275, 5,310,869 and EP0664211A2 are only some of the prior art teachings in the field of ablation.
2. Laser scanned regions lead to decreased solvent-solubility, usually due to chemical crosslinking of the polymeric compositions. A development step that follows laser scanning will cause the unscanned regions to be washed away by suitable solvents, thereby exposing the underlying surface. Chemistries that become less solvent-soluble following irradiation, are called negative-acting.
3. Laser-scanned areas undergo increased solvent-solubilization, usually due to chemical bond-breaking, or decomposition reactions, causing film removal in laser-scanned areas after development in a suitable solvent or, preferably water-based solutions. Such systems are called positive-acting Some references relative to prior art imaging systems that broadly cover applications both for PCB and digital printing plates:

1. Emerging Technologies, Printed Circuit Fabrication, pp. 12–15, Vol. 18, No. 9, September 1995.
2. Technical Information, Bulletin AQM-130A, entitled AQUA MER CFIL, UV LASER DIRECT IMAGING PHOTORESIST, issued by Hercules in 1995.
3. U.S. Pat. Nos. 4,132,168, 4,717,639, 5,401,618, 4,555, 471, 5,487,852, 5,353,705 and many others.

As to polymeric compositions that are envisioned for use as top, laser-patternable layers overlaying the metallic resists of this invention, one skilled in the art has at his/her disposal a very broad selection relying on chemistries reported in the field of microlithography, printed circuits primary/secondary resists, digital or flexographic printing, and generally the very vast field of photochemical polymer reactions. The guidelines to successfully choose the top layer chemistry for this invention are:

1. High sensitivity, or low energy needs, affording fast scanning by the appropriate laser.
2. Coating thickness as thin as practicable that achieves both high scan-speed and adequate protection during copper metal etching, acting in a complementary, synergistic manner with he underlying metallic resist.
3. Compositions should preferably be water-based for environmental considerations.
4. Easily strippable after selective copper metal etching is completed, unless stripping is unnecessary because the top patternable layer, together with the underlying metallic resist can remain as part of a permanent structural composite of the PCB assembly. This can indeed be the case if laser patterning is done on inner layers of multi-layer PCB (well-known in the art), where the top layer is an epoxy and the underlying metal-based resist is for example tin immersion or copper oxide.

5. The metallic-based layer that is to act as a "co-resist" during copper etching, should preferably be chosen to optimize absorption of the laser energy at the selected wavelength, and minimize reflection. Black cupric oxides well-known in the art of PCBs can also advantageously act as IR energy absorbers, as well as co-resists during copper etching, especially if copper etchants are ammoniacal.

6. The top, laser-imageable layer can itself be designed to optimize energy absorption via incorporation of suitable dyes as suggested by U.S. Pat. Nos. 5,262,275, 5,501,938, 4,555,471, 5,401,618 and many others.

The metal-bearing, metallic-type coating or coatings that are to act as co-resist during copperetching can be applied by numerous techniques known in the prior art, i.e. vapor deposition, sputtering, chemical deposition over the copper cladding of the PCB basis material, chemical reactions with the copper base substrate, etc., or combinations thereof. Typically, CuO, non-electrolytic tin (known in the art as "chemical" or "immersion") Bismuth, black nickel electroless nickel, etc., will preferably be done chemically.

The invention can be practiced via a single metallic layer or via combination of several metallic layers, preferably no more than two, in order to keep the process simple and easily practicable.

As mentioned earlier, very thin metallic coatings tend to be prone to pinhole formation. When such coatings serve as etch resists, the pinholes will result in defects during etching. Multiple coatings, or at least more than one, will greatly improve pinhole-free etch resisting. As an example, if metallic resists are applied to the copper-cladding by way of sputtering, the choice can be aluminum followed by bismuth, or titanium, not necessarily in this order.

If deposition of the metallic resist is done chemically, one may for example follow the CuO formation with immersing the laminate in alkaline tin-immersion solutions that will "plug" possible pinholes in the cupric oxide with immersion tin. Indeed, tin deposition will only occur where the copper-cladding foil is exposed to the alkaline tin solution, i.e. where pinholes in the cupric oxides are present allowing the displacement reaction to take place ($Cu^0+Sn^2+ \rightleftharpoons Cu^{++}+Sn^0$). Combinations of sputtering one metallic layer, then following the operation with an immersion type chemical deposition of another metallic layer, is well within the scope of the present invention. Also, it is an inherent benefit of the present invention that the laser-imageable top coating will also contribute to pinhole "plugging" in the metallic resist.

Again, the copper-clad laminate already coated with thin metallic resists can be supplied by PCB laminate producer as an article or "package", ready for laser imaging.

In one preferred embodiment of this invention, the copper etchant itself also removes the metallic layer or layers that are exposed following laser patternings, at the same time as it etches out unwanted copper, to form conductors. This is especially true if the copper etchant is based on cupric chloride chemistry, predominantly used in manufacturing copper conductors for inner-layers that are part of a multi-layer board (MLB) assembly. Indeed, acidic cupric chloride will remove thin layers of copper oxide, tin, Bi, Al, Ti and others in the same etcher that dissolves the copper cladding (25 5o 30µ thick) from unwanted areas, to form conductors.

In the case where the etchant of choice is of the ammoniacal type, a separate "pickling" step may be required that will strip the metallic layers that are bared (uncovered) following laser imaging of the top polymeric coating. This is then followed by ammoniacal copper etching. The entire PCB patterning process, including imaging can be streamlined and automated via horizontal spray processing equipment, another advantageous feature of this invention, as a result of laser imaging without phototools.

Again, acid "pickling" solutions that will quickly strip/remove the layer(s) of metallic resist prior to copper etching, can be chosen from proprietary or published compositions based on acidic $FeCl_3$, $Fe(NO_3)_3$, Ammonium persulfate, and many others, some of which are used in the industry to strip tin-lead, where the latter serves as copper etch resist.

As to the polymeric, laser imageable chemistries, the industry and the prior art offer a wealth of methods to precision-coat substrates with liquid polymeric photosensitive compositions. Such methods include spin-coating (the method of choice in wafer fabrication/imaging, where 1 micron resist thicknesses are predominant), coating via "roller", curtain, spray, and many others. Of special interest are coating methods used in producing UV-sensitive imaging film for PCBs, known in the trade as "dry films", perfected by companies such as Rexham Graphics Inc., Eastman Kodak, MacDermid Inc., DuPont and others.

As to the chemistry of laser-imageable compositions, they can be adapted by modifying prior art imaging formulation designed for conventional "phototool-exposed" systems, or laser DW systems, whether ablation type, or negative/positive-acting chemistries that require development. Thus, in the practice of present invention, the top, laser-imageable layer can be adapted from product offerings in microlithography, printed circuit imaging, and especially from the field of digital printing, as mentioned earlier. As a reference, U.S. Pat. No. 5,262,275 mentioned earlier provides detailed options for IR laser-ablatable chemistries, albeit designed for digital printing. In essence, the above reference teaches IR-ablatable compositions based on polymeric binders and IR-absorbing compounds, i.e. dyes, carbon black and the like.

Once again, one of the salient advantages of the present invention is that the laser imageable resist layer does not need to carry the full "burden" of the etch resistance, in contrast with prior art practices, where a single polymeric resist determines success, failure, and overall quality of the copper conductor patterns, especially as to defects such as pinholes, shorts, edge-wall profile, i.e. whether conductor "walls" are straight or sloped. Straight wall conductor walls are highly preferred where constant electrical impedance is desired.

Negative-acting UV laser imageable chemistries can be adapted from the prior art teachings currently practiced via phototools, for example such as disclosed U.S. Pat. No. 3,469,982 (dry film) U.S. Pat. No. 4,789,620 (solder-mask), and many others, by incorporation of appropriate dyes and sensitizers designed to improve sensitivity (greater scanning speeds). Indeed, the teachings of this present patent make the choice of the laser imageable resist chemistry less stringent, less critical and easier, because etch resistance is principally contributed by the underlying metallic layer or layers, relying on the laser imageable layer principally, often solely, for high resolution and sharp/clean image development.

In the selection of appropriate dyes for a given laser, see Laser Dyes by Mitsuo Maeda, Academic Press, Inc. 1984. It is one of the many helpful references in the literature.

Positive-acting UV laser imageable chemistries can be chosen from abundantly disclosed information both in publications and patents, related to microlithographic imaging. The two principal resist types are solvent-based diazonovolak solutions or on chemistries known as amplification, the latter being of special interest in the Deep UV absorption region (~240 nm). Again, provision may need to be made for optimum absorption for a given laser by incorporation of appropriate dye or dyes, binders, etc.

Some helpful references are:
1. Polymer Materials for Electronics, ACS Symposium Series 184, 1982.
2. Chemically Amplified Resists, AT & T Bell Laboratories, SPIE Volume 1086, Advances in Resists Technology and Processing VI (1989).
3. An aqueous base developable novel deep UV resist for KrF excimer laser lithography, SPIE vol. 1262, Advances in Resist Technology and Processing VII (1990).

As to the thickness of both the metallic resist(s) and laser-imageable resist(s), both should be as thin as practicable, as long as freedom from pinholes and other defects are insured. Indeed, a balance will need to be achieved between the thickness and number of layers (the thicker the coatings, the more pinhole free) and the speed of operation (the thicker the coating(s), especially the laser-imageable layer), the slower the operation.

Also, while the present patent is mainly directed towards manufacturing PCBs, other applications where patterning via laser offers an opportunity (chemical milling, LCDs, etc.), are within its scope and will be obvious to those skilled in the art.

Figure 2:
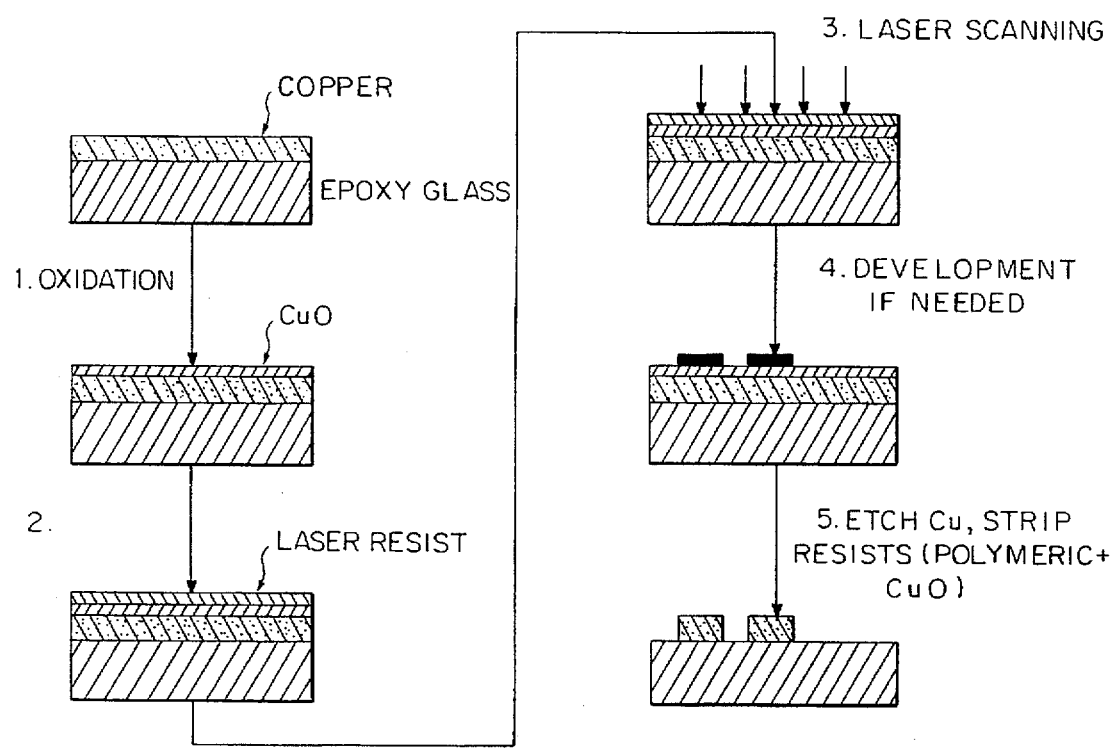
In FIG. 2, a cupric oxide layer acts as the auxiliary etch resist and is covered with the laser-imageable coating.
Figure 3:
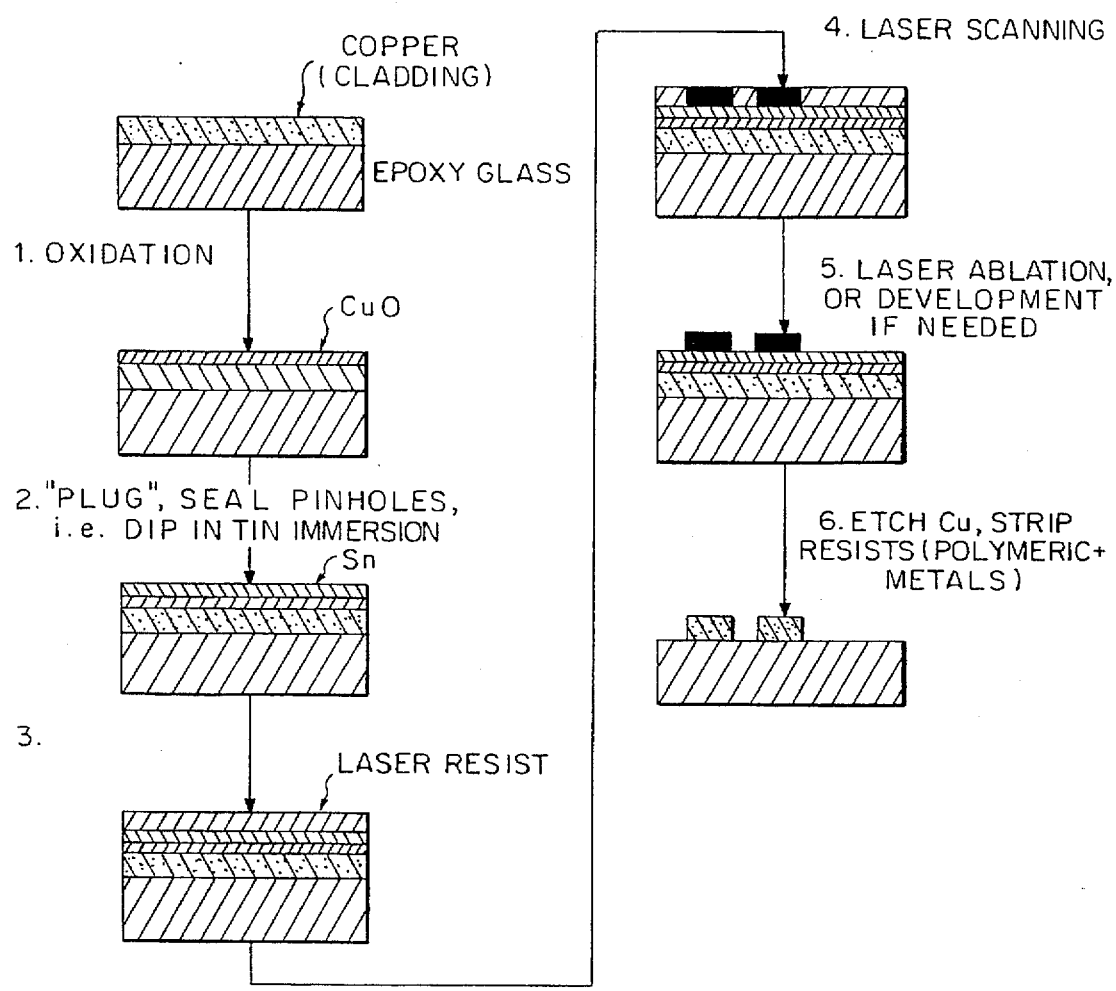
In FIG. 3 a tin immersion step is inserted over the cupric oxide coating, to minimize the presence of possible pin holes. Tin immersion can be replaced with other immersion-type metallic layers, i.e. electroless nickel. The laser-imageable top coat covers the two metallic type etch resist layers to principally achieve laser patterning.
Figure 4:
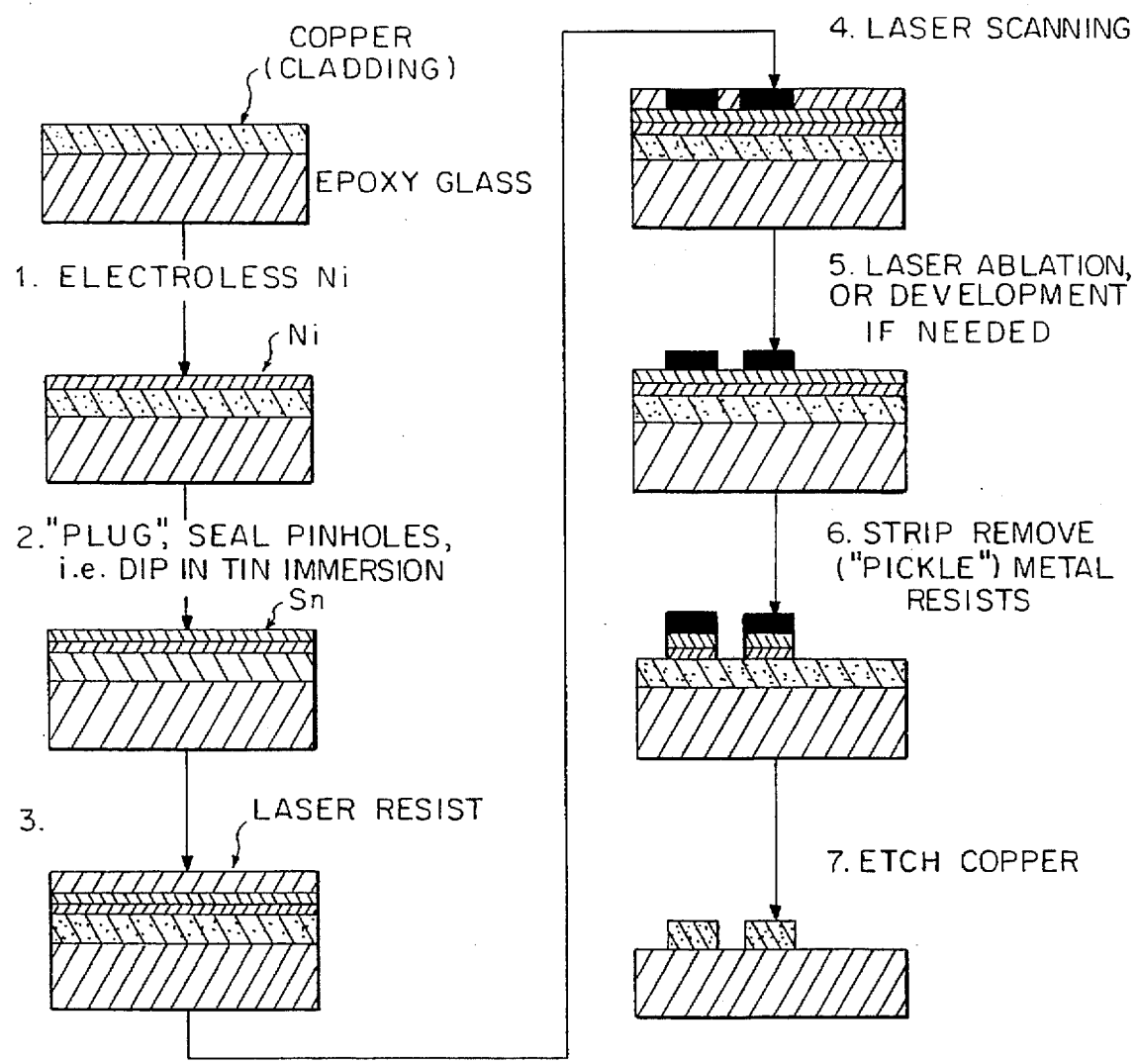
In FIG. 4 a combination of electroless nickel and tin serve as metallic etch resists, topped by the laser patternable coating.

FIGS. 1 to 4 are schematic presentations of potential variations of the ways the present patent can be implemented. The examples certainly not exhaustive as to other modes of execution and reductionto-practice.

I claim:

1. A process for manufacturing a printed circuit board (PCB) using laser imaging, comprising the steps of:
    a) coating a surface of the copper cladding of a copper-clad laminate having a nonablative substrate with at least one thin layer of metal other than copper, a metal alloy, or at least one thin layer of a metal-based compound which can act as a copper etch resist,
    b) coating a surface of the layer obtained in step (a) with at least one laser-patternable polymeric coating,
    c) a single, laser imagewise scanning of the polymeric coating obtained in step (b),
    d) developing a laser-scanned surface resulting from step (c), so as to expose the layers obtained in step (a),
    e) etching or stripping the layers obtained in step (a), so as to expose a bare copper metal cladding of the laminate,
    f) etching a copper pattern of alternating conductors separated by insulating spaces on the laminate, and
    g) stripping away the polymeric areas left on the surface of the metallic coatings obtained in step (b).

2. A process according to claim 1, wherein the metal layer is selected from the group consisting of immersions tin, aluminum, bismuth, titanium, and thereof.

3. A process according to claim 1, wherein the metal alloy is selected from the group consisting of Ni/P and Ni/B.

4. A process according to claim 1, wherein the metal-based compound is selected from a group consisting of cupric oxide, cuprous acid or combinations thereof, and black nickel.

5. A process according to claim 1 wherein laser scanning results in ablation of the polymeric coating.

6. A process according to claim 5 wherein the laser is of the IR type.

7. A process according to claim 1 wherein the laser emits in the UV region of the spectrum.

8. A process according to claim 1 wherein the laser is of the excimer type.

9. A process according to claim 1 wherein the Cu pattern is produced on a inner layer PCB.

10. A process according to claim 1 wherein the Cu pattern is produced on a multilayer PCB assembly.

11. The process according to claim 1, further comprising the step of stripping away the layers obtained in step (a), so as to expose the copper conductor pattern.

12. A printed circuit board manufactured according to claim 1.

13. A laminate consisting of a copper foil adhering to an insulating base wherein the surface of the copper foil is coated with at least one layer of metal other than copper that can act as copper etch resist.

14. An element according to claim 13 wherein at least one metal layer is selected from the group consisting of Ni/P, NiB, non-electrolyte tin, aluminum, bismuth, titanium and combinations thereof.

15. An element according to claim 13 wherein the top surface of the metal layer is covered with IR laser-imageable polymeric layer.

16. A process according to claim 1 wherein the manufacturing sequence is automated.

17. A process according to claim 1 wherein automation is done via a sequence of horizontal equipment.

18. A process according to claim 15 wherein a UV laser is used.

19. A process according to claim 1 wherein the metallic etch resist layers are combinations of (a), (b), and (c), wherein (a) is a metal layer selected from the group consisting of immersions of tin, aluminum, bismuth, titanium, and combinations thereof, (b) is a metal alloy layer selected from the group consisting of Ni/P or Ni/B, and (c) is a metal based compound layer selected from the group consisting of cupric oxide, cuprous acid or combinations thereof, and black nickel.

* * * * *